(12) United States Patent
Chen et al.

(10) Patent No.: US 11,963,450 B2
(45) Date of Patent: Apr. 16, 2024

(54) METHOD FOR MANUFACTURING CORE-SHELL COAXIAL GALLIUM NITRIDE (GaN) PIEZOELECTRIC NANOGENERATOR

(71) Applicant: Guangdong University of Technology, Guangzhou (CN)

(72) Inventors: Yun Chen, Guangzhou (CN); Pengfei Yu, Guangzhou (CN); Aoke Song, Guangzhou (CN); Zijian Li, Guangzhou (CN); Maoxiang Hou, Guangzhou (CN); Xin Chen, Guangzhou (CN)

(73) Assignee: Guangdong University of Technology, Guangzhou (CN)

( * ) Notice: Subject to any disclaimer, the term of this patent is extended or adjusted under 35 U.S.C. 154(b) by 0 days.

(21) Appl. No.: 18/448,861

(22) Filed: Aug. 11, 2023

(65) Prior Publication Data
US 2023/0389431 A1    Nov. 30, 2023

(30) Foreign Application Priority Data
Sep. 5, 2022    (CN) .......................... 202211078445.2

(51) Int. Cl.
*H10N 30/082*    (2023.01)
*B82Y 40/00*     (2011.01)
(Continued)

(52) U.S. Cl.
CPC ......... *H10N 30/082* (2023.02); *H10N 30/081* (2023.02); *B82Y 10/00* (2013.01);
(Continued)

(58) Field of Classification Search
CPC .... H10N 30/082; H10N 30/081; H10N 30/30; B82Y 40/00; B82Y 10/00; Y10T 29/42
See application file for complete search history.

(56) References Cited

U.S. PATENT DOCUMENTS

| | | | |
|---|---|---|---|
| 2011/0033974 A1 | 2/2011 | Wang | |
| 2012/0322164 A1* | 12/2012 | Lal | B82Y 10/00 |
| | | | 374/E11.018 |
| 2013/0106244 A1 | 5/2013 | Liu | |

FOREIGN PATENT DOCUMENTS

| | | |
|---|---|---|
| CN | 111509062 A | 8/2020 |
| CN | 112382691 A | 2/2021 |

(Continued)

OTHER PUBLICATIONS

Tiwary et al, "Piezoresponse force microscopy (PFM) characterization of GaN nanowires grown by Plasma assisted Molecular beam epitaxy (PA-MBE)," 2016 Joint IEEE Intl Symp on the App of Ferroelectrics, European Conference on App of Polar Dielectrics, and Piezoelectric ForceMicro Wrkshp, 2016, pp. 1-4. (Year: 2016).*

*Primary Examiner* — A. Dexter Tugbang

(57) ABSTRACT

A method for manufacturing a core-shell coaxial gallium nitride (GaN) piezoelectric nanogenerator is provided. A mask covering a center part of a gallium nitride wafer is removed. An electrodeless photoelectrochemical etching is performed on the gallium nitride wafer to form a primary GaN nanowire array on a surface of the gallium nitride wafer. A precious metal layer provided on the surface of the gallium nitride wafer is removed and an alumina layer is deposited on the surface of the gallium nitride wafer to cover the primary GaN nanowire array to obtain a core-shell coaxial GaN nanowire array. A first conductive layer is provided on a flexible substrate to which the core-shell coaxial GaN nanowire array is transferred. A second conductive layer is provided at a top end of the core-shell coaxial GaN nanowire array, and is connected to an external circuit to obtain the core-shell coaxial GaN piezoelectric nanogenerator.

8 Claims, 5 Drawing Sheets

(51) Int. Cl.
*H10N 30/081* (2023.01)
*B82Y 10/00* (2011.01)
*H10N 30/30* (2023.01)

(52) U.S. Cl.
CPC .............. *B82Y 40/00* (2013.01); *H10N 30/30* (2023.02); *Y10T 29/42* (2015.01)

(56) References Cited

FOREIGN PATENT DOCUMENTS

| | | | |
|---|---|---|---|
| CN | 112531070 A | | 3/2021 |
| CN | 114899304 A | | 8/2022 |
| JP | 2007073577 A | * | 3/2007 |

* cited by examiner

METHOD FOR MANUFACTURING CORE-SHELL COAXIAL GALLIUM NITRIDE (GaN) PIEZOELECTRIC NANOGENERATOR

CROSS-REFERENCE TO RELATED APPLICATIONS

This application claims the benefit of priority from Chinese Patent Application No. 202211078445.2, filed on Sep. 5, 2022. The content of the aforementioned application, including any intervening amendments thereto, is incorporated herein by reference in its entirety.

TECHNICAL FIELD

This application relates to microelectronic devices, and more particularly to a method for manufacturing core-shell coaxial gallium nitride (GaN) piezoelectric nanogenerator.

BACKGROUND

Increasingly strict requirements have been put forward for battery capacity and size of small implantable-wearable flexible electronic products. Supercapacitors or large-capacity batteries are generally preferable, but their capacity and size limit the improvement of durability and the development of miniaturization. Thus, there is an urgent need for a small self-powered generator. Currently, it is feasible to harvest electric energy from ambient energy such as solar energy, thermal energy, and mechanical energy, and for the wearable devices, mechanical energy (e.g., friction, vibration, and pressure) is the more readily-available form of energy.

Gallium nitride (GaN) presents a wurtzite structure in the crystal structure, with an asymmetric center position, and has a strong spontaneous polarization and piezoelectric polarization, making it applicable to the piezoelectric devices. Moreover, gallium nitride also has good thermal stability and high chemical stability. Compared with the bulk gallium nitride, gallium nitride nanowires can withstand greater deformation, and will produce a significant piezoelectric output when subjected to mechanical deformation.

The current methods for accurately fabricating high-quality nanowire arrays mainly include bottom-up processing (e.g., chemical vapor deposition (CVD) and top-down processing (e.g., dry etching and wet etching). Regarding the former, nanowires are directly formed on the substrate, and have excellent performance, but the process often requires high temperature and high-pressure conditions and complex operation and equipment. For the latter, an as-grown bulk wafer is etched to form nanowires, but the dry etching often causes damage to the crystal, which will further reduce the optical and electrical properties of the nanowires. Compared with dry etching, the wet etching is easy to operate and will not damage the material. Unfortunately, the wet etching (i.e., isotropic etching) makes the etching morphology uncontrollable. Thus, there is an urgent need to propose a wet etching method that can effectively fabricate nanowire arrays with high quality.

In addition, in semiconductor-based piezoelectric nanogenerators, what most affects the piezoelectric output is the shielding effect inside the semiconductor, which will strongly affect the piezoelectric output of the semiconductor-based piezoelectric nanogenerators. Therefore, there is an urgent need to seek for a technique that can effectively reduce the shielding effect of the internal carriers.

SUMMARY

An object of the application is to provide a core-shell coaxial gallium nitride (GaN) piezoelectric nanogenerator and a method for preparing the same. By means of the fabrication method provided herein, the internal shielding effect of the GaN nanowires can be alleviated, and the piezoelectric output can be improved. Moreover, a high-quality nanowire array can be formed by electrodeless photoelectrochemical etching.

Technical solutions of this application are described as follows.

This application provides a method for manufacturing a core-shell coaxial gallium nitride (GaN) piezoelectric nanogenerator based on wet etching, the core-shell coaxial gallium nitride piezoelectric nanogenerator including a core-shell coaxial gallium nitride nanowire array and a flexible substrate; a first conductive layer being provided on a surface of the flexible substrate; the core-shell coaxial gallium nitride nanowire array being fixed to the flexible substrate; a top end of the core-shell coaxial gallium nitride nanowire array being provided with a second conductive layer; the first conductive layer and the second conductive layer being connected to an external circuit via a wire; and a nanowire of the core-shell coaxial gallium nitride nanowire array being covered with an alumina layer; and the method including:

(1) covering a center part of a gallium nitride wafer with a mask; and providing a precious metal layer on a surface of the gallium nitride wafer;

(2) removing the mask from the gallium nitride wafer; and performing an electrodeless photoelectrochemical etching on the gallium nitride wafer to form a primary gallium nitride nanowire array on the center part of the gallium nitride wafer;

(3) removing the precious metal layer from the surface of the gallium nitride wafer; and depositing the alumina layer on the surface of the gallium nitride wafer by magnetron sputtering to cover the primary gallium nitride nanowire array to obtain the core-shell coaxial gallium nitride nanowire array; and (4) providing the first conductive layer on the surface of the flexible substrate; and transferring the core-shell coaxial gallium nitride nanowire array to the flexible substrate; and providing the second conductive layer at the top end of the core-shell coaxial gallium nitride nanowire array; and connecting the second conductive layer with the external circuit through the wire to obtain the core-shell coaxial gallium nitride piezoelectric nanogenerator;

wherein in step (4), the first conductive layer is deposited on the flexible substrate by magnetron sputtering; the second conductive layer includes a metal bonding layer and a gold layer; the metal bonding layer is deposited on the top end of the core-shell coaxial gallium nitride nanowire array by magnetron sputtering; and the gold layer is deposited on the metal bonding layer by magnetron sputtering.

In an embodiment, in step (2), the electrodeless photoelectrochemical etching is performed at an etching speed of 500~600 nm/min in an etching solution; the etching solution is an aqueous potassium persulfate-potassium hydroxide solution; and a concentration of both potassium persulfate and potassium hydroxide in the etching solution is 0.1 mol/L.

In an embodiment, the method further includes:
after obtaining the core-shell coaxial gallium nitride nanowire array, spin-coating and curing an insulating resin on the surface of the gallium nitride wafer; and
subjecting the insulating resin to inductively-coupled plasma etching to expose the top end of the core-shell coaxial gallium nitride nanowire array.

In an embodiment, the inductively-coupled plasma etching is performed at a pressure of 160 mTorr using an oxygen-carbon tetrafluoride inductively-coupled plasma, wherein a flow rate of oxygen is 20 sccm, and a flow rate of carbon tetrafluoride is 50 sccm; and the oxygen-carbon tetrafluoride inductively-coupled plasma has an excitation power of 100 W and a direct current radio frequency power of 300 W.

In an embodiment, in step (4), the core-shell coaxial gallium nitride nanowire array is peeled from the gallium nitride wafer with a doctor blade; and the core-shell coaxial gallium nitride nanowire array is fixed on the flexible substrate with a thermosetting adhesive.

In an embodiment, a thickness of the alumina layer is 5-10 nm.

In an embodiment, the metal bonding layer is arranged between the gold layer and the core-shell coaxial gallium nitride nanowire array.

In an embodiment, the core-shell coaxial gallium nitride nanowire array is filled with an insulating material.

Compared to the prior art, this application has the following beneficial effects.

The core-shell coaxial gallium nitride piezoelectric nanogenerator provided herein includes a core-shell coaxial nanowire array formed by alumina (shell) and gallium nitride (core), which can increase the piezoelectric output current density, greatly improve the piezoelectric output performance of gallium nitride, and realize the high-efficiency mechanical energy harvesting, thereby overcome the defects in the existing small implantable-wearable devices that the battery has a small capacity, a short service life, and a large size.

The core-shell coaxial gallium nitride piezoelectric nanogenerator is prepared based on the wet etching. Specifically, the gallium nitride wafer is subjected to electrodeless photoelectrochemical etching to form a high-quality gallium nitride nanowire array, and the morphology of the gallium nitride nanowire array can be controlled by regulating the etching parameters.

The nanogenerator provided herein has simple structure, easy operation, low cost and high sensitivity, and can be applied to the electronic components with small size, light weight, and high output. The nanogenerator can facilitate the miniaturization and weight reduction of electronic components while ensuring high output.

In the figures: 101—gallium nitride wafer; 102—polyimide (PI) tape; 104—precious metal layer; 105—gallium nitride nanowire array; 201—core-shell coaxial gallium nitride nanowire array; 202—insulating resin; 303—Teflon beaker; 304—acrylic plate; 305—ultraviolet (UV) lamp; 401—squeegee; 501—conductive silver epoxy resin; 503—first conductive layer; 504—flexible substrate; 505—metal bonding layer; and 506—gold layer.

DETAILED DESCRIPTION OF EMBODIMENTS

The disclosure will be further described in detail below with reference to the embodiments and accompanying drawings. The same or similar reference signs denote the same or similar elements or elements having the same or similar function throughout the drawings. It should be understood that the embodiments described herein are only used to illustrate and explain this application, and are not intended to limit the disclosure.

As used herein, it should be understood that the orientation or positional relationship indicated by the terms "longitudinal", "lateral", "upper", "lower", "front", "rear", "left", "right", "vertical", "horizontal", "top", "bottom", "inside", "outside", etc. is based on the orientation or positional relationship shown in the accompanying drawings, which is only for the convenience of describing the technical solutions and simplifying the description, rather than indicating or implying that the indicated device or element must have a specific orientation, be constructed or operated in a specific orientation. Therefore, these terms should not be understood as a limitation of the present disclosure. In addition, the terms "first" and "second" are used for distinguishing the features, cannot be understood as indicating or implying relative importance, and may expressly or implicitly indicate that one or more of the referred features are included.

As used herein, unless otherwise expressly specified and defined, the term "a plurality of" means two or more.

As used herein, unless otherwise expressly specified and defined, terms, such as "mount" and "connect", should be interpreted in a broad sense, for example, it may be fixed connection, detachable connection, or integral connection; it may be mechanical direction or electrical connection; it may be direct connection or indirect connection through an intermediate medium; and it may be an internal communication between two members. For those skilled in the art, the specific meanings of the above terms can be understood according to specific situations.

The core-shell coaxial gallium nitride (GaN) piezoelectric nanogenerator and its preparation will be described below with reference to FIGS. 1-5.

Figure 5:
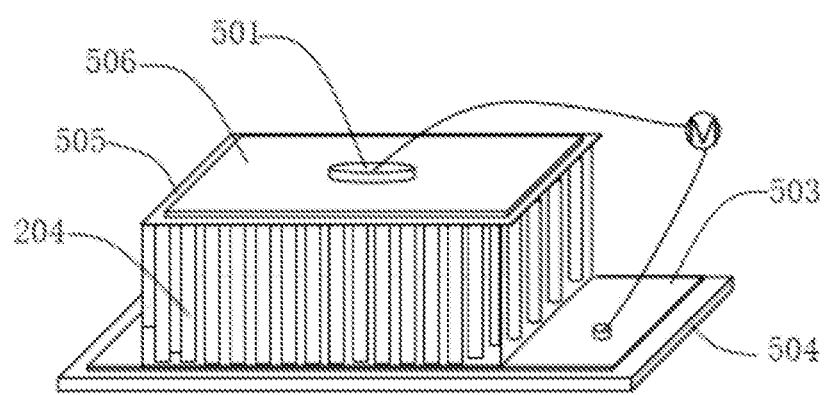
FIG. 5 is a schematic diagram of the core-shell coaxial gallium nitride piezoelectric nanogenerator according to one embodiment of the present disclosure.

As shown in FIG. 5, the core-shell coaxial gallium nitride piezoelectric nanogenerator includes a core-shell coaxial gallium nitride nanowire array 201 and a flexible substrate 504.

A first conductive layer 503 is provided on the surface of the flexible substrate 504. The core-shell coaxial gallium nitride nanowire array 201 is fixed to the flexible substrate 504. A top end of the core-shell coaxial gallium nitride nanowire array 201 is provided with a second conductive layer. The first conductive layer 503 and the second conductive layer are connected to an external circuit via wires.

A nanowire of the core-shell coaxial gallium nitride nanowire array 201 is covered with an alumina layer.

The thin alumina layer is deposited on the gallium nitride nanowires to form a core-shell coaxial structure. The thin alumina layer is a high-resistance layer or even an insulating layer, and contacts with the gallium nitride to form a huge contact barrier, which can effectively reduce the internal shielding of the gallium nitride nanowires and improve the piezoelectric output.

It should be noted that the second conductive layer is connected to the wire by conductive silver epoxy resin. Specifically, the first conductive layer on the surface of the flexible substrate is an indium film.

In an embodiment, the thickness of the alumina layer is 5-10 nm. The core-shell coaxial structure mainly relies on the high resistance of the alumina and contacts with the gallium nitride to form a potential barrier to reduce the internal shielding of the piezoelectricity. In view of the poor conductivity of the alumina layer, excessive thickness will result in high resistance and poor piezoelectricity output, and the alumina layer with small thickness cannot effectively reduce the internal shielding of the piezoelectric effect.

In an embodiment, the contact point (the second conductive layer) includes a metal bonding layer 505 and a gold layer 506. The metal bonding layer 505 is disposed between the gold layer 506 and the core-shell coaxial gallium nitride nanowire array 201. The metal bonding layer 505 is a titanium or nickel layer. The principle of using titanium or nickel as a binder is mainly that the titanium or nickel is inactive and prevents possible diffusion between the gold layer and the alumina layer, while acting as an adhesive.

In order to ensure the independence of each nanowire in the core-shell coaxial gallium nitride nanowire array, the core-shell coaxial gallium nitride nanowire array is filled with insulating material. The insulating material also maintains the structural stability of the core-shell coaxial gallium nitride nanowire array. Preferably, the insulating material is a resin. In an embodiment, the insulating material is a mixture of dimethyl siloxane and a curing agent.

The disclosure provides a method for preparing the core-shell coaxial gallium nitride piezoelectric nanogenerator based on wet etching, which includes the following steps.

(1) A center part of the gallium nitride wafer 101 is covered with a mask. A precious metal layer 104 is provided on a surface of the gallium nitride wafer 101.

(2) The mask is removed from the gallium nitride wafer 101. The electrodeless photoelectrochemical etching is performed on the gallium nitride wafer 101 to form the primary gallium nitride nanowire array 105 on the surface of the gallium nitride wafer 101.

(3) The precious metal layer 104 is removed from the surface of the gallium nitride wafer 101. The alumina layer is deposited on the surface of the gallium nitride wafer 101 by magnetron sputtering to cover the primary gallium nitride nanowire array 105 to obtain the core-shell coaxial gallium nitride nanowire array 201.

(4) The first conductive layer 503 is provided on the surface of the flexible substrate 504. The core-shell coaxial gallium nitride nanowire array 201 is transferred to the flexible substrate 504.

Further, the second conductive layer is provided on at the top end of the core-shell coaxial gallium nitride nanowire array. The second conductive layer is connected with the external circuit through the wire to obtain the core-shell coaxial gallium nitride piezoelectric nanogenerator.

In the method in this disclosure, the high-quality gallium nitride nanowire arrays can be obtained by performing electrodeless photoelectrochemical etching on gallium nitride. The electrodeless photoelectrochemical etching includes the following advantages. 1. No external power supply is required. The etching can be performed directly on the gallium nitride wafer with the insulating substrate. 2. The precious metal layer is plated on the surface of the gallium nitride wafer. The built-in electric field is formed under the action of the metal-semiconductor contact. The holes are injected along a direction of the electric field, accelerating the etching rate in the vertical direction, and guiding the downward etching. 3. The etched nanowires are formed from nanopores. The bottom of each of the nanopores is generally beveled edge. In the role of vertical UV illumination, the beveled edge of the bottom of the nanopore can receive more UV illumination than the vertical pore wall. In other words, the rate of the longitudinal etching of the pore is larger than that of the transverse etching, and nanowire arrays can be formed by etching. Under the effect of metal-semiconductor contact, different light receiving surfaces and selective etching, the electrodeless photoelectrochemical etching can realize better anisotropic etching, thereby processing various regular structures, such as array holes, nanowires, and nano cones.

The electrodeless photoelectrochemical etching of gallium nitride nanowire arrays is simple and efficient. The morphology of the gallium nitride nanowire arrays can be controlled by regulating the etching parameters and the etching rate on the gallium nitride wafers with the insulating substrate can be improved.

In an embodiment, in step (1), the precious metal layer is provided on the surface of the gallium nitride wafer by magnetron sputtering for 3 minutes with the sputtering current of 10 mA and the vacuum degree of $5 \times 10^{-6}$ Pa. The center part of the gallium nitride wafer is covered with a mask. The mask may be a band that can play a masking role and is easy to remove, such as PI tape.

Specifically, in step (2), the electrodeless photoelectrochemical etching is performed at an etching speed of 500-600 nm/min in an etching solution. The etching solution is an aqueous potassium persulfate-potassium hydroxide solution. The concentration of both potassium persulfate and potassium hydroxide in the etching solution is 0.1 mol/L. The mixed aqueous solution of potassium persulfate and potassium hydroxide is used as the etching solution, realizing the selective etching on the defect-free gallium nitride or on flaws in the gallium nitride. By controlling the selective etching, it also contributes to the formation of anisotropic etching. In an embodiment, the etching solution may also be a mixed solution of hydrogen peroxide and hydrofluoric acid. But the mixed aqueous solution of potassium persulfate and potassium hydroxide as the etching solution can obtain better etching morphology and etching speed.

It should be noted that the processing rate of nanowires is the etching rate. The etching rate relies on the type of the precious metal, etching solution ratio and light intensity. The etching rate of 500-600 nm/min can obtain high-quality and complete gallium nitride nanowire arrays.

In order to make the core-shell coaxial gallium nitride nanowire arrays structurally stable and the nanowires independent of each other, after obtaining the core-shell coaxial gallium nitride nanowire array, the insulating resin is spin-coated and cured on the surface of the gallium nitride wafer. Then, the insulating resin is subjected to the inductively-coupled plasma etching to expose the top end of the core-shell coaxial gallium nitride nanowire array. Specifically, the exposed height is 70-120 nm to facilitate external circuit. The insulating resin spin-coated on the surface of the gallium nitride wafer is dimethyl siloxane (PDMS). The insulating resin is cured by drying. Preferably, the dimethyl siloxane is mixed with the curing agent, and the volume ratio of the dimethyl siloxane to the curing agent is 10:1.

The inductively-coupled plasma etching is used to make the top end of the core-shell coaxial gallium nitride nanowire array exposed. In this embodiment, the inductively-coupled plasma etching is performed at a pressure of 160 mTorr using an oxygen-carbon tetrafluoride inductively-coupled plasma. A flow rate of oxygen is 20 sccm, and a flow rate of carbon tetrafluoride is 50 sccm. The oxygen-carbon tetrafluoride inductively-coupled plasma has an excitation power of 100 W and a direct current radio frequency power of 300 W. The etching time is 5 min to expose the top end of the core-shell coaxial gallium nitride nanowire arrays.

In an embodiment, in step (4), the first conductive layer is deposited on the flexible substrate by magnetron sputtering. The second conductive layer includes the metal bonding layer and the gold layer. The metal bonding layer is deposited at the top end of the core-shell coaxial gallium nitride nanowire array by magnetron sputtering. Then, the gold layer is deposited on the metal bonding layer by magnetron sputtering. Specifically, the indium film is deposited at the flexible substrate by magnetron sputtering for 5 minutes with the sputtering current of 10 mA and the vacuum degree of $5 \times 10^{-6}$ Pa. The second conductive layer is provided by sputtering for 5 min to forming the nickel layer with the thickness of 20 nm and by sputtering for 25 min to forming the gold layer with the thickness of 150 nm under the sputtering current of 10 mA and the vacuum degree $5 \times 10^{-6}$ Pa. In this embodiment, the nickel serves as the binder between the gold layer and the gallium nitride nanowire array.

Further, in step (4), the core-shell coaxial gallium nitride nanowire arrays are peeled from the gallium nitride wafer with a doctor blade. The core-shell coaxial gallium nitride nanowire arrays are fixed to the flexible substrate with a thermosetting adhesive.

Specifically, in step (3), the precious metal layer on the surface of the gallium nitride wafer, which is a platinum layer, is removed by using a mixed solution of hydrochloric acid and nitric acid with a mass ratio of 8:7:1 ($H_2O$:HCl:$HNO_3$).

The disclosure will be further described below according to embodiments. Referring to FIGS. 1-4, the method for preparing a core-shell coaxial gallium nitride piezoelectric nanogenerator based on wet etching includes the following steps.

The step (1) was performed as follows.

(11) A gallium nitride wafer 101 was cleaned with deionized water, soaked in acetone solution, cleaned in an ultrasonic cleaner for 10 min, washed with deionized water, and dried by nitrogen blowing.

(12) A cleaned PI tape 102 of 0.8 cm×0.8 cm was covered on the center part of the gallium nitride wafer 101 of 1 cm×1 cm. A precious metal layer 104 (platinum layer) was formed by magnetron sputtering for 5 minutes with sputtering current of 10 mA and vacuum degree of $5 \times 10^{-6}$ Pa to obtain primary gallium nitride nanowire arrays 105.

(2) The PI tape 102 was removed from the surface of the gallium nitride wafer 101. The electrodeless photoelectrochemical etching was performed on the gallium nitride wafer 101. In this embodiment, the gallium nitride wafer 101 was fixed in a Teflon beaker 303. An ultraviolet (UV) lamp 305 was fixed at the distance of 1 cm from the gallium nitride wafer 101. The UV lamp 305 was separated from the Teflon beaker 303 using an acrylic plate 304. The etching solution was added into the Teflon beaker using a dropper. The UV lamp 305 was turned on, and the etching was performed for 20 min to finish etching. Then the UV lamp 305 was turned off, and the etched gallium nitride wafer 101 was taken out, cleaned with deionized water, and dried by nitrogen blowing.

The step (3) was performed through the following steps.

(31) The gallium nitride wafer 101 was placed in a mixed solution of hydrochloric acid and nitric acid and etched for 4 min, where a weight ratio of $H_2O$ to HCl to $HNO_3$ in the mixed solution was 8:7:1. Then the precious metal layer 104 was removed to obtain the gallium nitride nanowire array without the platinum layer, which was washed with de-ionized water and dried by nitrogen blowing.

(32) An alumina layer was formed on the surface of the gallium nitride wafer 101 by magnetron sputtering to cover the gallium nitride nanowire array to form a core-shell coaxial gallium nitride nanowire array 201. The thickness of the alumina layer was 5-10 nm. The magnetron sputtering conditions were set as follows: sputtering current: 10 mA; the vacuum degree of the vacuum cavity was adjusted to $5 \times 10^{-6}$ Pa before sputtering; the sputtering was performed for 3 min with the sample covered by the baffle plate and then the baffle plate was removed, and the sputtering was performed on the sample for 1 min

(33) An insulating resin 202 (PDMS) was spin-coated on the surface of the gallium nitride wafer with the alumina layer using a spin coater. Specifically, 0.05 mL of PDMS and 0.005 mL of the curing agent were taken with a pipette and spin-coated onto the core-shell coaxial gallium nitride nanowire array 201 using the spin coater. The spin-coating was performed at 500 rpm for 9 s and at 1500 rpm for 30 s. The insulating resin was cured by drying at 180° C. for 10 min.

(34) The inductively-coupled plasma etching was performed on the insulating resin 202 on the surface of the gallium nitride wafer 101, so that the top end of the core-shell coaxial gallium nitride nanowire array 201 was exposed. In this embodiment, the inductively-coupled plasma etching was performed at a pressure of 160 mTorr using an oxygen-carbon tetrafluoride inductively-coupled plasma. A flow rate of oxygen was 20 sccm, and a flow rate of carbon tetrafluoride was 50 sccm. The oxygen-carbon tetrafluoride inductively-coupled plasma had an excitation power of 100 W and a direct current radio frequency power of 300 W. The etching time was 5 min to expose the top end of the core-shell coaxial gallium nitride nanowire array.

The step (4) was performed through the following steps.

(41) The first conductive layer 503 was deposited on the flexible substrate 504 made of PET by magnetron sputtering. The first conductive layer 503 was an indium film. Specifically, the indium film was deposited at the flexible substrate 504 by magnetron sputtering for 5 min with a sputtering current of 10 mA and a vacuum degree of $5 \times 10^{-6}$ Pa.

Figure 1:
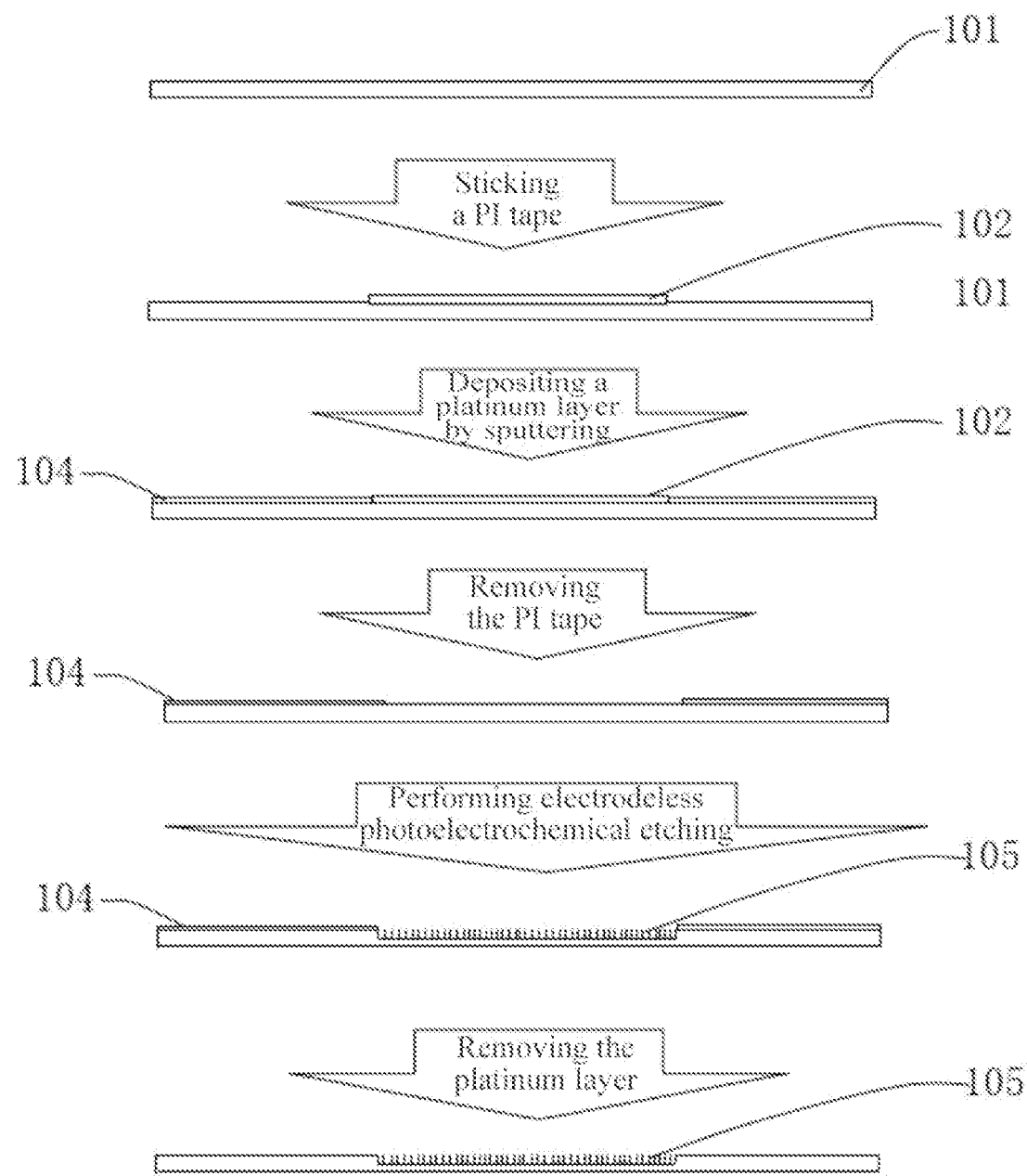
FIG. 1 is a flow chart of steps (1) and (2) of a method of manufacturing a core-shell coaxial gallium nitride piezoelectric nanogenerator based on wet etching according to one embodiment of the present disclosure.
Figure 2:
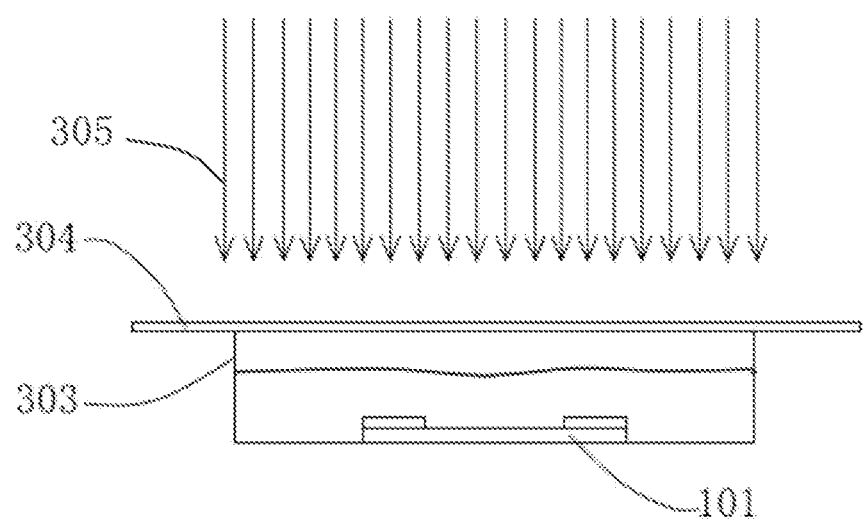
FIG. 2 schematically illustrates electrodeless photoelectrochemical etching on a gallium nitride wafer in step (2)
Figure 3:
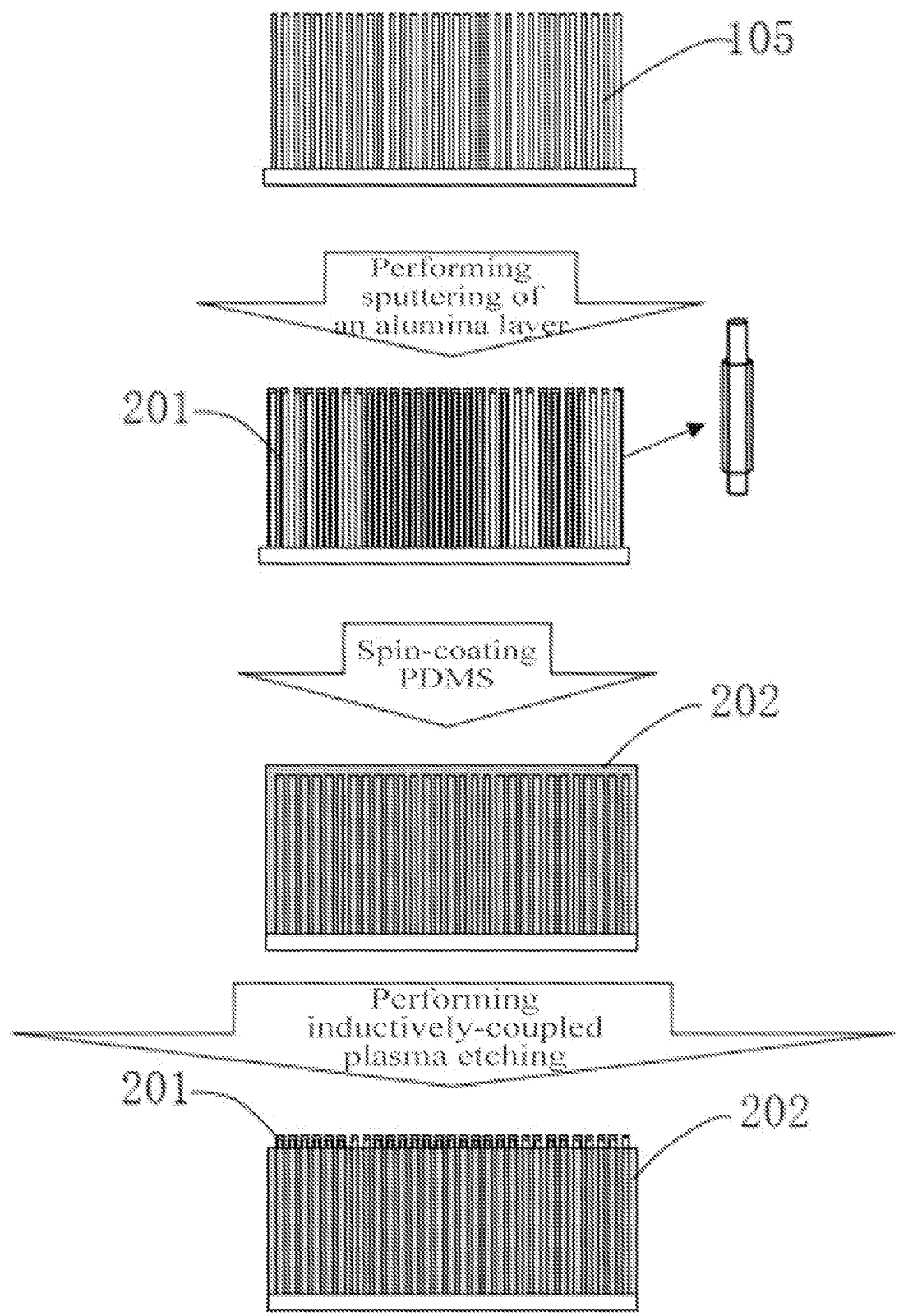
FIG. 3 is a flow chart of step (3) of the method according to one embodiment of the present disclosure.
Figure 4:
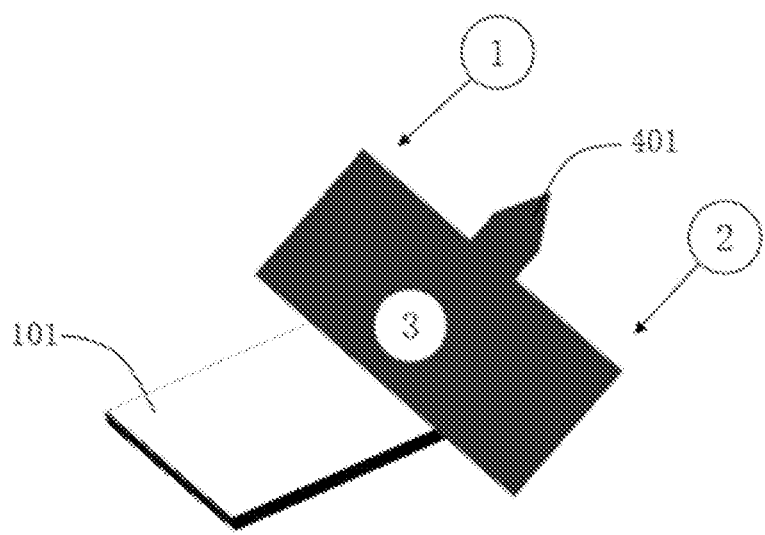
FIG. 4 is a flow chart of a step of "peeling the core-shell coaxial gallium nitride nanowire array from the gallium nitride wafer" in step (4) of the method according to one embodiment of the present disclosure.

(42) As shown in FIG. 4, a forward force was uniformly applied on point location 1 and point location 2 of the squeegee 401 while pressing down on point location 3 with a finger until the core-shell coaxial gallium nitride nanowire array was peeled towards the end of the gallium nitride wafer 101, transferred to the indium-coated flexible substrate, and fixed by the thermosetting adhesive.

(43) Nickel and gold were respectively deposited onto the top end of the core-shell coaxial gallium nitride nanowire array 201 by magnetron sputtering as the second conductive layer, with the sputtering current of 10 mA and the vacuum degree of $5\times10^{-6}$ Pa. In this embodiment, the sputtering time of the nickel layer was 5 min, and the thickness of the sputtered nickel layer was 20 nm. The sputtering time of the gold layer was 25 min, and the thickness of the sputtered gold layer was 150 nm. In this embodiment, nickel served as the adhesive between the gold and the gallium nitride nanowire arrays.

(44) The wires were connected to the second conductive layer on the top end of the core-shell coaxial gallium nitride nanowire array 201 and the first conductive layer 503 of the flexible substrate 504 by means of conductive silver epoxy 501 to complete the assembly of the piezoelectric nanogenerator.

Other compositions and operations of the core-shell coaxial gallium nitride piezoelectric nanogenerator and a preparation method thereof according to an embodiment of the disclosure are known to those skilled in the art and will not be described in detail herein.

In this disclosure, the description with reference to the terms "embodiment", "example", etc. is intended to mean that a specific feature, structure, material, or characteristic described in connection with the embodiment or example is included in at least one embodiment or example of the disclosure. In the disclosure, schematic expressions of the above terms do not necessarily refer to the same embodiment or example. Moreover, the specific features, structures, materials, or characteristics described may be combined in any one or more embodiments or examples in a suitable manner.

Described above are merely preferred embodiments of the disclosure, which are not intended to limit the disclosure. It should be understood that any modifications and replacements made by those skilled in the art without departing from the spirit of the disclosure should fall within the scope of the disclosure defined by the appended claims.

What is claimed is:

1. A method for manufacturing a core-shell coaxial gallium nitride (GaN) piezoelectric nanogenerator based on wet etching, the core-shell coaxial gallium nitride piezoelectric nanogenerator comprising a core-shell coaxial gallium nitride nanowire array and a flexible substrate; a first conductive layer being provided on a surface of the flexible substrate; the core-shell coaxial gallium nitride nanowire array being fixed to the flexible substrate; a top end of the core-shell coaxial gallium nitride nanowire array being provided with a second conductive layer; the first conductive layer and the second conductive layer being connected to an external circuit via a wire; and a nanowire of the core-shell coaxial gallium nitride nanowire array being covered with an alumina layer; and the method comprising:

covering a center part of a gallium nitride wafer with a mask; and providing a precious metal layer on a surface of the gallium nitride wafer;

removing the mask from the gallium nitride wafer; and performing an electrodeless photoelectrochemical etching on the gallium nitride wafer to form a primary gallium nitride nanowire array on the center part of the gallium nitride wafer;

removing the precious metal layer from the surface of the gallium nitride wafer; and depositing the alumina layer on the surface of the gallium nitride wafer by magnetron sputtering to cover the primary gallium nitride nanowire array to obtain the core-shell coaxial gallium nitride nanowire array; and providing the first conductive layer on the surface of the flexible substrate; and transferring the core-shell coaxial gallium nitride nanowire array to the flexible substrate; and providing the second conductive layer at the top end of the core-shell coaxial gallium nitride nanowire array; and connecting the second conductive layer with the external circuit through the wire to obtain the core-shell coaxial gallium nitride piezoelectric nanogenerator;

wherein the first conductive layer is deposited on the flexible substrate by magnetron sputtering; the second conductive layer comprises a metal bonding layer and a gold layer; the metal bonding layer is deposited on the top end of the core-shell coaxial gallium nitride nanowire array by magnetron sputtering; and the gold layer is deposited on the metal bonding layer by magnetron sputtering.

2. The method of claim 1, wherein the electrodeless photoelectrochemical etching is performed at an etching speed of 500~600 nm/min in an etching solution; the etching solution is an aqueous potassium persulfate-potassium hydroxide solution; and a concentration of both potassium persulfate and potassium hydroxide in the etching solution is 0.1 mol/L.

3. The method of claim 1, further comprising:

after obtaining the core-shell coaxial gallium nitride nanowire array, spin-coating and curing an insulating resin on the surface of the gallium nitride wafer; and subjecting the insulating resin to inductively-coupled plasma etching to expose the top end of the core-shell coaxial gallium nitride nanowire array.

4. The method of claim 3, wherein the inductively-coupled plasma etching is performed at a pressure of 160 mTorr using an oxygen-carbon tetrafluoride inductively-coupled plasma, wherein a flow rate of oxygen is 20 sccm, and a flow rate of carbon tetrafluoride is 50 sccm; and the oxygen-carbon tetrafluoride inductively-coupled plasma has an excitation power of 100 W and a direct current radio frequency power of 300 W.

5. The method of claim 1, wherein the core-shell coaxial gallium nitride nanowire array is peeled from the gallium nitride wafer with a doctor blade; and the core-shell coaxial gallium nitride nanowire array is fixed on the flexible substrate with a thermosetting adhesive.

6. The method of claim 1, wherein a thickness of the alumina layer is 5-10 nm.

7. The method of claim 1, wherein the metal bonding layer is arranged between the gold layer and the core-shell coaxial gallium nitride nanowire array.

8. The method of claim 1, wherein the core-shell coaxial gallium nitride nanowire array is filled with an insulating material.

* * * * *